United States Patent
Watanabe et al.

(10) Patent No.: US 8,350,270 B2
(45) Date of Patent: Jan. 8, 2013

(54) SILICON CARBIDE SEMICONDUCTOR DEVICE AND METHOD FOR MANUFACTURING THE SAME

(75) Inventors: Shoyu Watanabe, Tokyo (JP); Shuhei Nakata, Tokyo (JP); Kenichi Ohtsuka, Tokyo (JP)

(73) Assignee: Mitsubishi Electric Corporation, Tokyo (JP)

( * ) Notice: Subject to any disclaimer, the term of this patent is extended or adjusted under 35 U.S.C. 154(b) by 59 days.

(21) Appl. No.: 12/921,250

(22) PCT Filed: Mar. 4, 2009

(86) PCT No.: PCT/JP2009/000965
§ 371 (c)(1),
(2), (4) Date: Sep. 7, 2010

(87) PCT Pub. No.: WO2009/110229
PCT Pub. Date: Sep. 11, 2009

(65) Prior Publication Data
US 2011/0012133 A1    Jan. 20, 2011

(30) Foreign Application Priority Data
Mar. 7, 2008    (JP) ................. 2008-057696

(51) Int. Cl.
*H01L 29/161*    (2006.01)
(52) U.S. Cl. ........... 257/77; 257/E29.255; 257/E21.092; 438/495
(58) Field of Classification Search ............. 257/77, 257/329, E29.255, E29.256, E21.092; 438/268, 438/495
See application file for complete search history.

(56) References Cited

U.S. PATENT DOCUMENTS

| 4,585,489 | A | * | 4/1986 | Hiraki et al. ........... 438/764 |
| 5,900,648 | A | * | 5/1999 | Harris et al. ........... 257/77 |
| 5,914,499 | A |   | 6/1999 | Hermansson et al. |
| 6,518,629 | B1 |  | 2/2003 | Kushida et al. |
| 6,774,434 | B2 | * | 8/2004 | Hueting et al. ........... 257/340 |
| 2003/0049930 | A1 | | 3/2003 | Disney |

(Continued)

FOREIGN PATENT DOCUMENTS

JP    6 334503    12/1994

(Continued)

OTHER PUBLICATIONS

Japanese Office Action for JP Application No. 2010-501799, dated Oct. 3, 2012, mailed Oct. 9, 2012, with English translation of relevant portions of the Office Action.

*Primary Examiner* — Wensing Kuo
(74) *Attorney, Agent, or Firm* — Oblon, Spivak, McClelland, Maier & Neustadt, L.L.P.

(57) ABSTRACT

A silicon carbide MOSFET that exhibits a high source-to-drain withstand voltage and that involves a smaller difference between gate-to-drain capacitance achieved in an activated state and gate-to-drain capacitance achieved in a deactivated state. A silicon carbide drift layer of a first conductivity type is provided on a silicon carbide substrate of a first conductivity type; a pair of base regions are provided in a surface layer portion of the silicon carbide drift layer and exhibit a second conductivity type; a pair of source regions are provided in interiors of surface layer portions of the pair of base regions and exhibit a first conductivity type; and semi-insulating regions are provided between the silicon carbide substrate and the pair of base regions.

5 Claims, 9 Drawing Sheets

U.S. PATENT DOCUMENTS

| | | |
|---|---|---|
| 2003/0057524 A1 | 3/2003 | Disney |
| 2003/0060001 A1 | 3/2003 | Disney |
| 2004/0082122 A1 | 4/2004 | Disney |
| 2005/0104121 A1 | 5/2005 | Disney |
| 2006/0057796 A1 | 3/2006 | Harada et al. |
| 2007/0293002 A1 | 12/2007 | Disney |

FOREIGN PATENT DOCUMENTS

| | | |
|---|---|---|
| JP | 9 511103 | 11/1997 |
| JP | 2000 164855 | 6/2000 |
| JP | 2000-208757 | 7/2000 |
| JP | 2001 15747 | 1/2001 |
| JP | 2002-531952 | 9/2002 |
| JP | 2003 224277 | 8/2003 |
| JP | 2004 6598 | 1/2004 |
| JP | 2004 312037 | 11/2004 |
| JP | 2005-510059 | 4/2005 |
| JP | 2006 140169 | 6/2006 |
| WO | 2004 036655 | 4/2004 |

\* cited by examiner

SILICON CARBIDE SEMICONDUCTOR DEVICE AND METHOD FOR MANUFACTURING THE SAME

TECHNICAL FIELD

The present invention relates to a high power semiconductor device using silicon carbide and, more particularly, to a MOSFET using silicon carbide and a method for manufacturing the same.

BACKGROUND ART

Switching noise sometimes arises at the time of switching operation of a power semiconductor, such as a MOSFET (Metal Oxide Semiconductor Field Effect Transistor). A MOSFET structure proposed in view of inhibiting occurrence of switching noise increases a difference between gate-to-drain capacitance achieved in an activated state and gate-to-drain capacitance achieved in a deactivated state, thereby decreasing a jump voltage of a drain voltage (see; for example, Patent Document 1).

Moreover, a silicon carbide MOSFET requires a withstand voltage which enables the MOSFET to withstand a voltage of the order of 1000V, and for this reason, a structure where a high voltage is applied in a reverse-bias direction to a p-type base layer and an n-type drift layer which have comparatively low concentration levels is employed for the silicon carbide MOSFET, and it is shown that the withstand voltage is determined by a depletion layer formed in a p-n junction (see; for example, Patent Document 2).

Further, there is a description about a semiconductor device using silicon carbide in which a silicon carbide layer is made semi-insulating by implanting protons and $He^{2+}$ ions into the layer (see; for example, Patent Document 3).

Patent Document 1: JP-A-2004-6598 (pp. 16 to 17)
Patent Document 2: International Publication WO 2004/36655 (pp. 5 to 6)
Patent Document 3: JP-T-9-511103 (pp. 13 to 15)

DISCLOSURE OF THE INVENTION

Problem that the Invention is to Solve

However, in the related-art MOSFET as described in Patent Document 1, which involves occurrence of a large difference between the gate-to-drain capacitance achieved in the activated state and the gate-to-drain capacitance achieved in the deactivated state, a charging current flows into parasitic capacitance formed in a depletion layer when the MOSFET is switched from a deactivated state to an activated state, whereupon an overshoot occurs in a drain current, and the overshoot sometimes exceeded a rated drain current, thereby breaking the MOSFET.

Such an overshoot in drain current is not limited to the MOSFET, such as that described in Patent Document 1, which has a p-layer in a channel region and which involves a large difference between the gate-to-drain capacitance achieved in the activated state and the gate-to-drain capacitance achieved in the deactivated state, but also occurs in a common MOSFET not having the p-layer in the channel region, to thus break the MOSFET.

In the MOSFET, in order to inhibit occurrence of the overshoot in drain current such as that described above, it is essential to make source-to-drain capacitance smaller and reduce an extension of the depletion layer formed between the p-type base layer and the n-type drift layer, but in order to reduce the extension of the depletion layer by increasing a concentration of impurities in the p-type base layer and in the n-type drift layer, it becomes difficult to assure a withstand voltage between the source and the drain as described in Patent Document 2.

The present invention has been conceived to solve the drawback and aims to provide a silicon carbide MOSFET which enables to assure a source-to-drain withstand voltage and which inhibits an overshoot in drain current.

Means for Solving the Problem

A silicon carbide semiconductor device of the present invention comprises: a silicon carbide substrate of a first conductivity type; a silicon carbide drift layer of a first conductivity type provided on a principal surface of the silicon carbide substrate; a pair of base regions which are provided in a surface layer portion of the silicon carbide drift layer while separated from each other and which exhibit a second conductivity type; a pair of source regions which are provided in interiors of surface layer portions of the pair of base regions and which exhibit a first conductivity type; a pair of semi-insulating regions which are provided between the silicon carbide substrate and the pair of base regions; a gate electrode provided on a surface of the silicon carbide drift layer through a gate insulating film; a source electrode provided while adjoining the source regions and the base regions; and a drain electrode provided on a surface of the silicon carbide substrate opposite to the principal surface thereof.

A method for manufacturing a silicon carbide semiconductor device of the present invention comprises: forming a first silicon carbide drift layer of a first conductivity type on a silicon carbide substrate; implanting impurity ions to exhibit a semi-insulating characteristic, into portions of a surface layer of the first silicon carbide drift layer with a predetermined space therebetween; forming a second silicon carbide drift layer on the first silicon carbide drift layer; implanting impurity ions of a second conductivity type into a portion of a surface layer of the second silicon carbide drift layer; and implanting impurity ions of a first conductivity type into a portion of the surface layer of the second silicon carbide drift layer.

Advantages of the Invention

According to the present invention, it is possible to acquire a silicon carbide semiconductor device which exhibits a high source-to-drain withstand voltage and which inhibits an overshoot in drain current by reducing fluctuations in source-to-drain capacitance occurring when switching takes place from a deactivated state to an activated state.

Additionally, according to the present invention, it is also possible to manufacture a silicon carbide semiconductor device which exhibits a high source-to-drain withstand voltage and which inhibits occurrence of an overshoot in drain current by reducing fluctuations in source-to-drain capacitance occurring when switching takes place from a deactivated state to an activated state.

BEST MODES FOR IMPLEMENTING THE INVENTION

First Embodiment

FIG. 1 is a cross-sectional schematic view showing a silicon carbide MOSFET which is a silicon carbide semiconductor device of a first embodiment of the present invention. The present embodiment is described regarding that a first conductivity type is an n-type and that a second conductivity type is a p-type.

In FIG. 1, an n-type silicon carbide drift layer 20 is formed over a first principal surface of a low-resistance silicon carbide substrate 10 whose first principal surface has a surface orientation (0001) and which has a 4H-polytype and is of n-type. A pair of p-type base regions 30 containing aluminum (Al) as a p-type impurity are formed in an area on a front side of the silicon carbide drift layer 20 including spacing of a certain width. A pair of n-type source regions 40 containing nitrogen (N) as an n-type impurity are formed in inner surface layer portions of the respective pair of base regions 30 in their cross-sectional directions, so as to become shallower than the respective base regions 30. Further, a pair of semi-insulating regions 90 containing vanadium (V) as an impurity are formed in the silicon carbide drift layer 20 located between the p-type base regions 30 and the silicon carbide substrate 10 while separated from each other at an interval which is larger than spacing between the base regions 30 and smaller than spacing between the source regions 40 and while adjoining to the respective base regions 30. Of the silicon carbide drift layer 20, a region other than the base regions 30, the source regions 40, and the semi-insulating regions 90 is hereinafter called a JFET region 201.

An insulating film 50 formed from silicon carbide is formed on the front side of the silicon carbide drift layer 20 including the base regions 30 and the source regions 40 with exception of portions of front sides of the base regions 30 and portions of front sides of the source regions 40. Moreover, a gate electrode 60 is formed in a cross-sectional interior of the insulating film 50 located at a position opposing spacing between the pair of source regions 40. Respectively, a source electrode 70 is formed on upper surfaces of the base regions 30 and upper surfaces of the source regions 40 where the insulating film 50 is not formed, and a drain electrode 80 is formed on a second principal surface of the silicon carbide substrate 10 opposite to its first principal surface; namely, an under side of the silicon carbide substrate.

In FIG. 1, areas in the base regions 30 which oppose the gate electrode 60 through the insulating film 50 and where an inversion layer is formed during activation are referred to as channel regions. In the silicon carbide semiconductor device of the present embodiment, the spacing between the pair of semi-insulating regions 90 is made larger than the spacing between the pair of base regions 30, and thus, an ON-current channel which spreads from a position immediately beneath the JFET region 201 located between the pair of base regions 30 and which extends from the channel regions and connects to the drain electrode 80 through the JFET region 201 of the silicon carbide drift layer 20 and the silicon carbide substrate 10 do not exhibit any semi-insulating characteristic, and a sufficient amount of ON current can be flown. Further, by making the spacing between the pair of semi-insulating regions 90 smaller than the spacing between the pair of source regions 40, the semi-insulating regions 90 are provided immediately below the source regions 40 to which a high voltage is applied at least during a deactivated period, so that the withstand voltage between the source and the drain can be enhanced.

The semi-insulating regions 90 are now described in detail. When a silicon carbide layer is implanted with transition metal like V, there is developed a deep level of the order of 0.2 to 1.0 eV from a conduction band. Since carriers are trapped in the deep level, the silicon carbide layer exhibits a semi-insulating characteristic of the order of $1 \times 10^8$ Ωcm.

Operation of the MOSFET which is the silicon carbide semiconductor device of the present embodiment is now described briefly. When a positive voltage which is a threshold voltage or more is applied to the gate electrode 60 of the MOSFET shown in FIG. 1, an inverting channel is formed in the channel region, and a channel through which electrons serving as carriers flow is formed between the n-type source regions 40 and the n-type silicon carbide drift layer 20. The electrons flowed from the source regions 40 into the silicon carbide drift layer 20 reach the drain electrode 80, through the silicon carbide drift layer 20 and the silicon carbide substrate 10, in accordance with an electric field generated by the positive voltage applied to the drain electrode 80. Therefore, an electric current flows from the drain electrode 80 to the source electrode 70 by application of the positive voltage to the gate electrode 60. This state is called an activated state.

In the case of the activated state, a high voltage is not applied to an area between the source electrode 70 and the drain electrode 80. Further, since regions adjoining beneath the base regions 30 of the present embodiment are the semi-insulating regions 90, capacitance develops between the base regions 30 and the silicon carbide substrate 10.

On the contrary, when a voltage which is a threshold voltage or less is applied to the gate electrode 60, the inverting channel is not formed in the channel region, and thus, an electric current does not flow from the drain electrode 80 to the source electrode 70. This state is called a deactivated state. Although a positive voltage is applied to the drain electrode 80 at this time, because areas adjoining beneath the base regions 30 are the semi-insulating regions 90, capacitance developing in the deactivated state comes to a sum of capacitance of the semi-insulating regions 90 and capacitance of a depletion layer extending to interiors of the base regions 30. Although the high voltage applied to an area between the base regions 30 and the silicon carbide substrate 10 is applied mainly to the semi-insulating regions 90, the semi-insulating regions 90 exhibit a semi-insulating characteristic, and thus, a withstand voltage is enhanced, and dielectric breakdown does not occur.

As mentioned above, in the MOSFET which is the silicon carbide semiconductor device of the first embodiment of the present invention, a source-to-drain capacitance difference occurring when switching takes place from the deactivated state to the activated state comes to capacitance corresponding to the capacitance of the extended depletion layer in the base regions 30 occurred in the deactivated state, and thus, capacitance fluctuations can be diminished, and occurrence of an overshoot in drain current can be inhibited. Therefore, when switching takes place from a deactivated state to an activated state, flow of a drain current exceeding a rated current can be prevented, so that reliability can be enhanced. Moreover, since the semi-insulating regions 90 are provided, a sufficiently large drain-to-source withstand voltage can be assured in the deactivated state.

A method for manufacturing the MOSFET which is the silicon carbide semiconductor device of the first embodiment is described in sequence by reference to FIGS. 2 through 9. FIGS. 2 through 9 are cross-sectional schematic views acquired in respective processes of manufacturing the MOSFET.

First, as shown in FIG. 2, a first silicon carbide drift layer 21 having an n-type impurity concentration of $1 \times 10^{15}$ cm$^{-3}$ to $1 \times 10^{17}$ cm$^{-3}$ and a thickness of 5 to 30 μm is formed, through epitaxial growth, on the surface of the silicon carbide substrate 10 by means of chemical vapor deposition (CVD).

Next, as shown in FIG. 3, a first implant mask 100 made of polycrystalline silicon is formed on a surface of the silicon carbide drift layer 20, and transition metal V, which is an impurity, is ion-implanted into the silicon carbide drift layer 21 on the surface of which the first implant mask 100 is formed. A depth to which V ions are to be implanted is set substantially to a thickness of the silicon carbide drift layer 21. An impurity concentration of ion-implanted V is set to about $4 \times 10^{15}$ cm$^{-3}$. In the first silicon carbide drift layer 21, an area ion-implanted with V comes into the semi-insulating regions 90.

The first implant mask 100 is subsequently eliminated as shown in FIG. 4.

As shown in FIG. 5, a second silicon carbide drift layer 22 which is identical with the first silicon carbide drift layer 21 in terms of an impurity concentration is formed, through epitaxial growth, on surfaces of the semi-insulating regions 90 which are ion-implanted with V and a surface of the silicon carbide drift layer 21 which is not ion-implanted with V, by means of CVD. A thickness of the second silicon carbide drift layer 22 is set to about 1 to 5 μm.

Next, after a second implant mask 101 has been formed on a surface of the second silicon carbide drift layer 22, as shown in FIG. 6, the second silicon carbide drift layer 22 is implanted with Al ions, which are a p-type impurity, by means of ion implantation, such that a concentration of about $2 \times 10^{18}$ cm$^{-3}$ is accomplished. A depth of implantation is substantially made equal to the thickness of the second silicon carbide drift layer 22, and ions are implanted such that a box profile is formed. Of the area in the second silicon carbide drift layer 22 implanted with Al ions, an area exhibiting p-type comes to the base regions 30. Here, the first silicon carbide drift layer 21 and the second silicon carbide drift layer 22 are taken in combination as the silicon carbide drift layer 20.

After elimination of the second implant mask 101, a third implant mask 102 is formed on a surface of the second silicon carbide drift layer 22 and the surface of the base region 30 such that opening is formed in a portion of the surface of the base region 30. As shown in FIG. 7, the base region 30 is then implanted with N ions, which are an n-type impurity, to a concentration of about $3 \times 10^{19}$ cm$^{-3}$. A depth of implantation is made shallower than the thickness of the base region 30, and implantation is carried out such that a box profile is formed. Of an area in the base region 30 implanted with N ions, an area exhibiting n-type comes to the source region 40.

After elimination of the third implant mask 102, the substrate is annealed in an inert gas atmosphere, such as an argon (Ar) gas, at a temperature from 1300 to 1900° C. for 30 seconds to one hour by means of heat treatment equipment. The implanted ions V, N, and Al are made active by means of annealing.

Subsequently, as shown in FIG. 8, the surface of the silicon carbide drift layer 20 including the source regions 40 and the base regions 30 is thermally oxidized, thereby generating a gate insulating film 51 having a desired thickness.

A polycrystalline silicon film exhibiting conductivity is formed on the gate insulation film 51 by means of low pressure CVD, and the polycrystalline silicon film is patterned, to thus produce the gate electrode 60. As shown in FIG. 9, an interlayer insulating film 52 made of silicon dioxide is formed on the gate insulating film 51 and the gate electrode 60, and the gate insulating film 51 and the interlayer insulating film 52 are opened.

Finally, the source electrode 70 electrically connected to the source regions 40 and the base regions 30 is formed, and the drain electrode 80 is formed on a back side of the silicon carbide substrate 10, whereupon an MOSFET (FIG. 1) is completed. An Al alloy, or the like, is mentioned as a material for the source electrode 70 and the drain electrode 80.

As shown in FIG. 1, the present embodiment has provided an example in which the semi-insulating regions 90 are provided over the entirety of the silicon carbide drift layer 20 in its thicknesswise direction between the base regions 30 and the silicon carbide substrate 10. The semi-insulating regions 90 may also be provided solely on the upper portion of the silicon carbide drift layer 20 between the base regions 30 and the silicon carbide substrate 10 as shown in FIG. 10, so long as the thickness of the semi-insulating regions 90 makes it possible to assure a source-to-drain withstand voltage.

In the embodiment, an impurity implanted into the semi-insulating regions 90 is taken as V, and the implant concentration of V is set to about $4 \times 10^{15}$ cm$^{-3}$. The impurity is not limited to V, so long as the impurity makes it possible to make the silicon carbide layer semi-insulating, and transition metals, such as chromium (Cr) and titanium (Ti), or protons, etc., may also be used. Further, it is better to select an impurity concentration according to a type of the impurity, so long as the impurity concentration makes a silicon carbide layer semi-insulating.

Moreover, the impurity implanted to make the base regions 30 is required to be a p-type impurity, and boron (B) ions, etc., other than the Al ions, may also be used. The impurity implanted to make the source regions is required to be a p-type impurity, and phosphorous (P) ions, etc., other than N ions may also be used. The concentrations of implanted impurities provided herein are mere illustrative and are not limited to the illustrated impurity concentrations.

A thermally-oxidized silicon carbide drift layer is mentioned as the gate insulating film 51. However, the gate insulating film is not limited to the thermally-oxidized silicon carbide drift layer, and a silicon oxide deposited film or other deposited films may also be used. Further, a material for the gate electrode 60 can be metal made by sputtering, such as aluminum and titanium. In addition, a material for the source electrode 70 and a material for the drain electrode 80 can also be titanium, gold, etc.

Second Embodiment

FIG. 11 is a cross-sectional schematic view showing a silicon carbide MOSFET which is a silicon carbide semiconductor device of a second embodiment of the present invention. The present embodiment is also described regarding that a first conductivity type is an n-type and that a second conductivity type is a p-type.

In FIG. 11, the silicon carbide semiconductor device of the present embodiment is identical with the silicon carbide semiconductor device described in the first embodiment except for that, spacing between the pair of semi-insulating regions 90 at lower ends thereof is larger than spacing between the pair of semi-insulating regions at upper ends thereof, lateral ends of the respective semi-insulating regions 90 are formed so as to be inclined with respect to the surface of the silicon carbide substrate 10, and the spacing between the pair of semi-insulating regions 90 at upper ends thereof is set so as to become greater than the spacing between the pair of base regions 30, and hence, explanation of the silicon carbide semiconductor device of the present embodiment is omitted.

A method for manufacturing the silicon carbide semiconductor device of the present embodiment is now described. The method for manufacturing a MOSFET which is the silicon carbide semiconductor device of the present embodiment is identical with the method for manufacturing the MOSFET of the first embodiment except the followings. Namely, in the first embodiment, V ions are implanted to the substrate substantially perpendicular to the substrate while the first implant mask 100 is formed. However, in place of the first implant mask 100, there is formed a fourth implant mask 110 which has a narrower width than that of the first implant mask 100. Additionally, V ions are implanted in an inclined direction with respect to the substrate. Processes which are different from those of the first embodiment are hereunder described.

As in the case with FIG. 2 of the first embodiment, the first silicon carbide drift layer 21 is formed on the surface of the silicon carbide substrate 10 through epitaxial growth, and as shown in FIG. 12, the fourth implant mask 110 made of polycrystalline silicon is subsequently formed on the surface of the silicon carbide drift layer 20, and V ions, which are an impurity, are implanted, at an inclined angle of 30°, into the silicon carbide drift layer 20 on the surface of which there is formed the fourth implant mask 110. A location where the fourth implant mask 110 is to be formed is determined at this time in consideration of the inclined angle of ion implantation and a thickness of the fourth implant mask 110. The fourth implant mask 110 is then eliminated.

As shown in FIG. 13, after a fifth implant mask 111 is formed, V ions are implanted, at an inclined angle of 30°, into the substrate while the substrate is rotated through 180°. After elimination of the fifth implant mask 111, processes are similar to those shown in FIGS. 4 through 10 of the first embodiment.

Schematic views acquired when the substrate in the processes shown in FIGS. 12 and 13 is viewed from above are provided in FIGS. 14 and 15. As shown in FIGS. 14 and 15, when the gate electrode 60 is a rectangle, the semi-insulating regions 90 are provided below respective two long sides of the gate electrode 60.

Incidentally, when the longitudinal and lateral lengths of the gate electrode 60 are substantially equal to each other, V ions may be implanted into the gate electrode from four directions while the substrate is rotated every 90° as shown in FIG. 16. In this case, since the ON current flow channel in the silicon carbide drift layer can sufficiently be assured, the ON current can be further increased.

Although the embodiment provides an example in which the V ions are implanted in the inclined angle of 30°, the angle is not limited to a value of 30° and can also be an value between 15° to 60°.

Moreover, although the present embodiment provides the case where the semi-insulating regions 90 extend up to the silicon carbide substrate 10, as shown in FIG. 17, even when the semi-insulating regions 90 do not reach the silicon carbide substrate 10 and are formed entirely inside the silicon carbide drift layer 20, a similar advantage is yielded.

Although the first conductivity type is taken as an n-type and the second conductivity type is taken as a p-type in the first and second embodiments, the conductivity types can be reversed.

DESCRIPTIONS OF THE REFERENCE NUMERALS AND SYMBOLS

Figure 1:
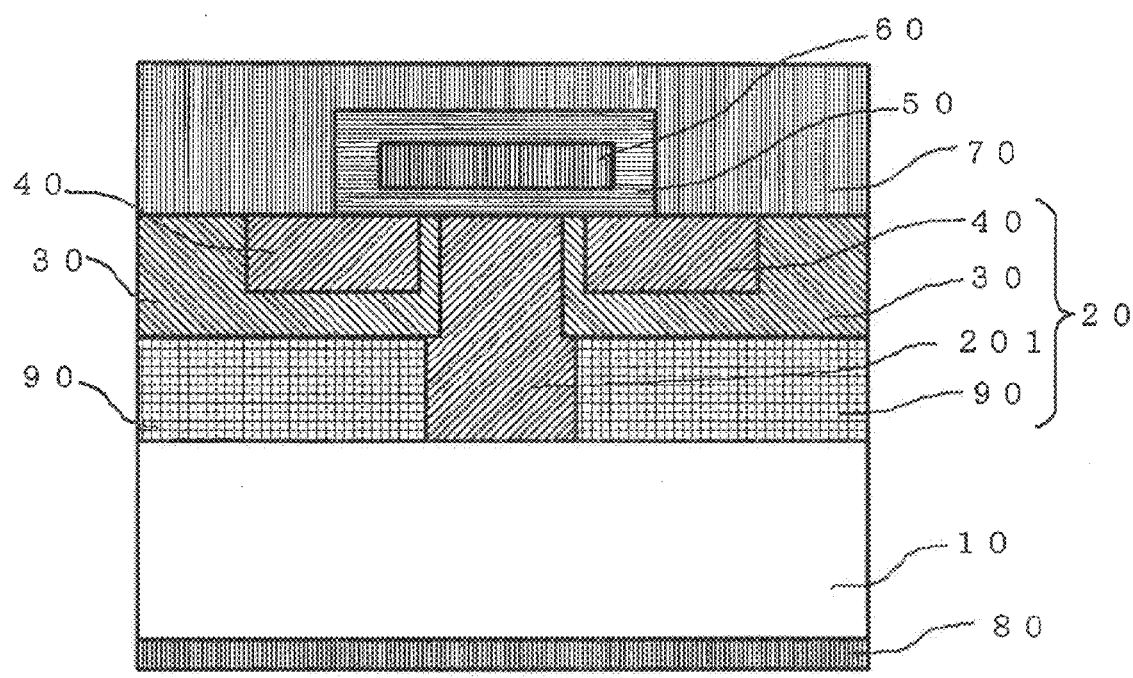
FIG. 1 is a cross-sectional schematic view showing a silicon carbide semiconductor device of a first embodiment of the present invention.
Figure 2:
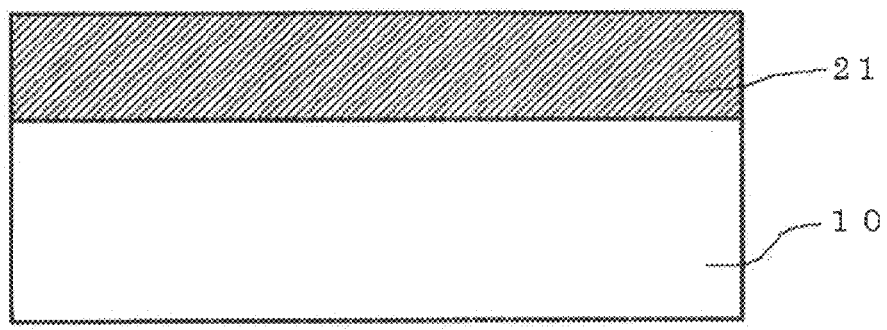
FIG. 2 is a cross-sectional schematic view showing a method for manufacturing the silicon carbide semiconductor device of the first embodiment of the present invention.
Figure 3:
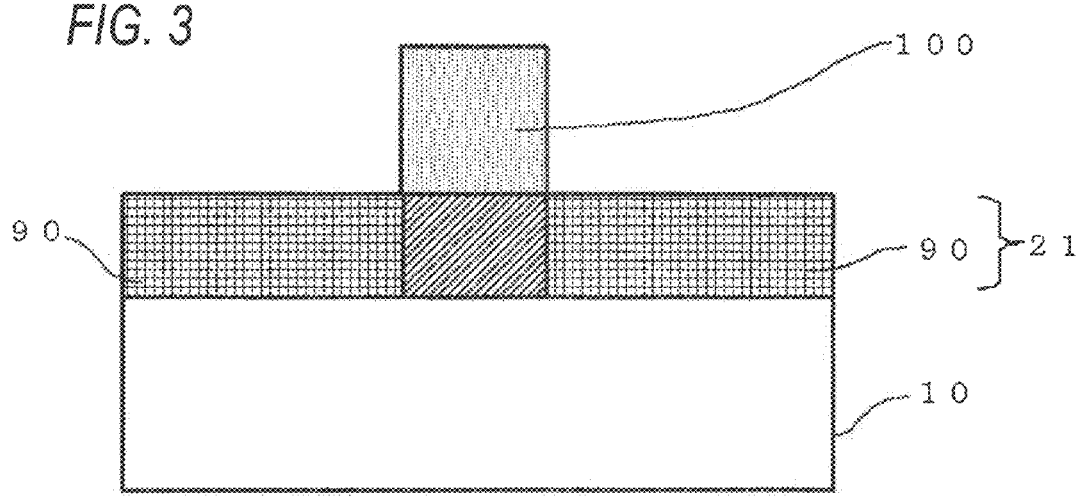
FIG. 3 is a cross-sectional schematic view showing the method for manufacturing the silicon carbide semiconductor device of the first embodiment of the present invention.
Figure 4:
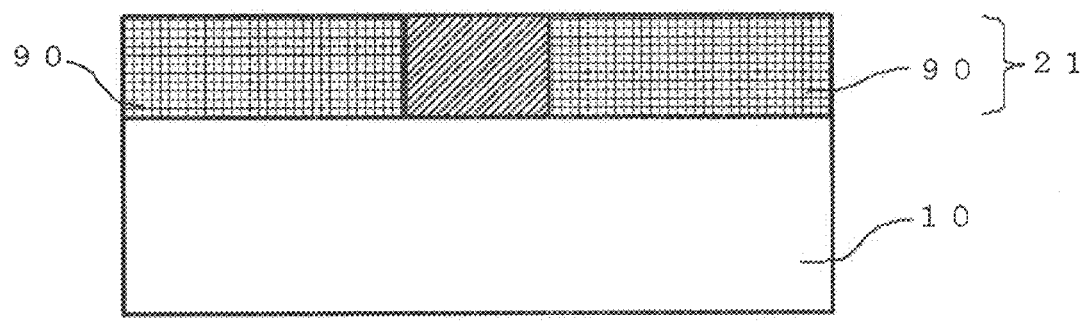
FIG. 4 is a cross-sectional schematic view showing the method for manufacturing the silicon carbide semiconductor device of the first embodiment of the present invention.
Figure 5:
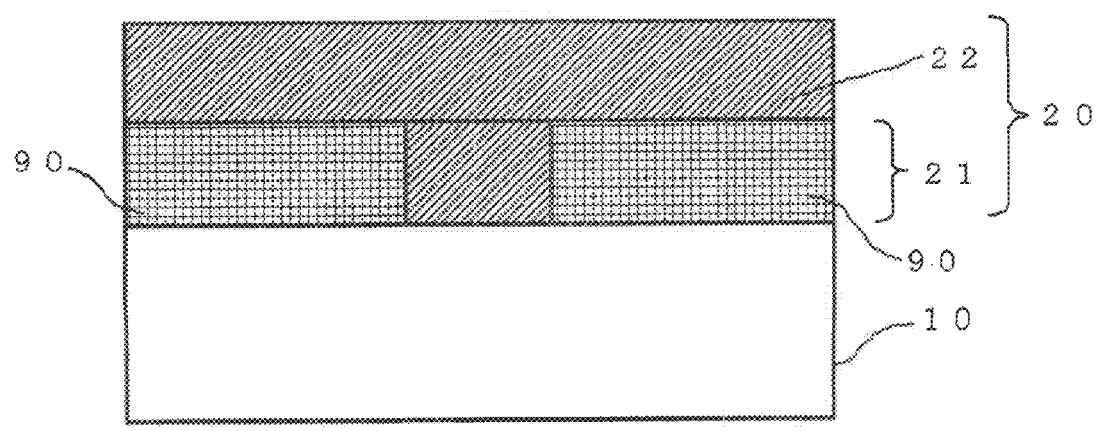
FIG. 5 is a cross-sectional schematic view showing the method for manufacturing the silicon carbide semiconductor device of the first embodiment of the present invention.
Figure 6:
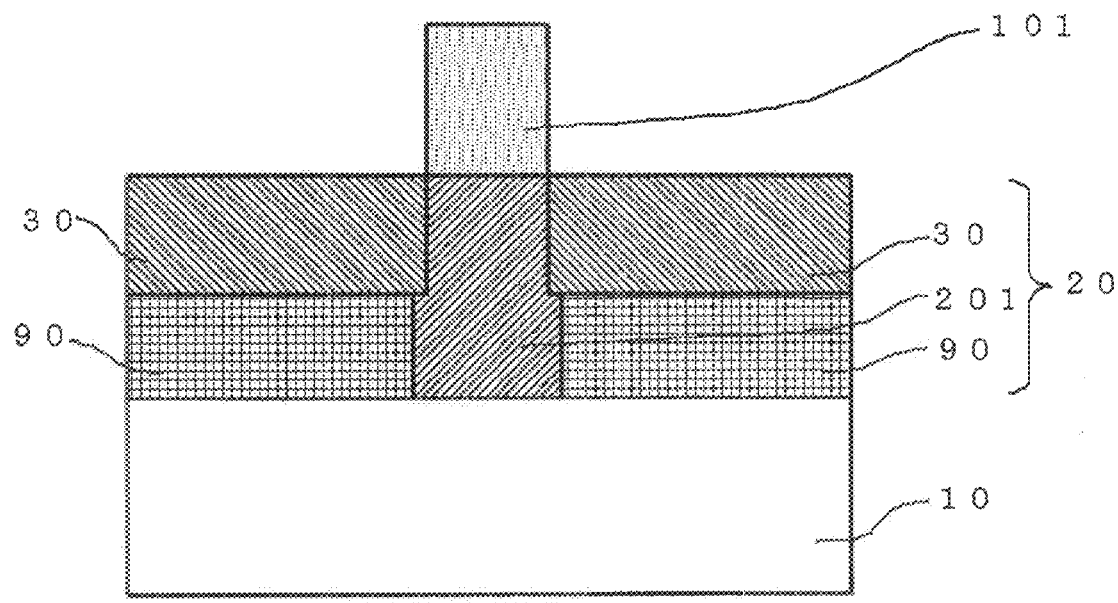
FIG. 6 is a cross-sectional schematic view showing the method for manufacturing the silicon carbide semiconductor device of the first embodiment of the present invention.
Figure 7:
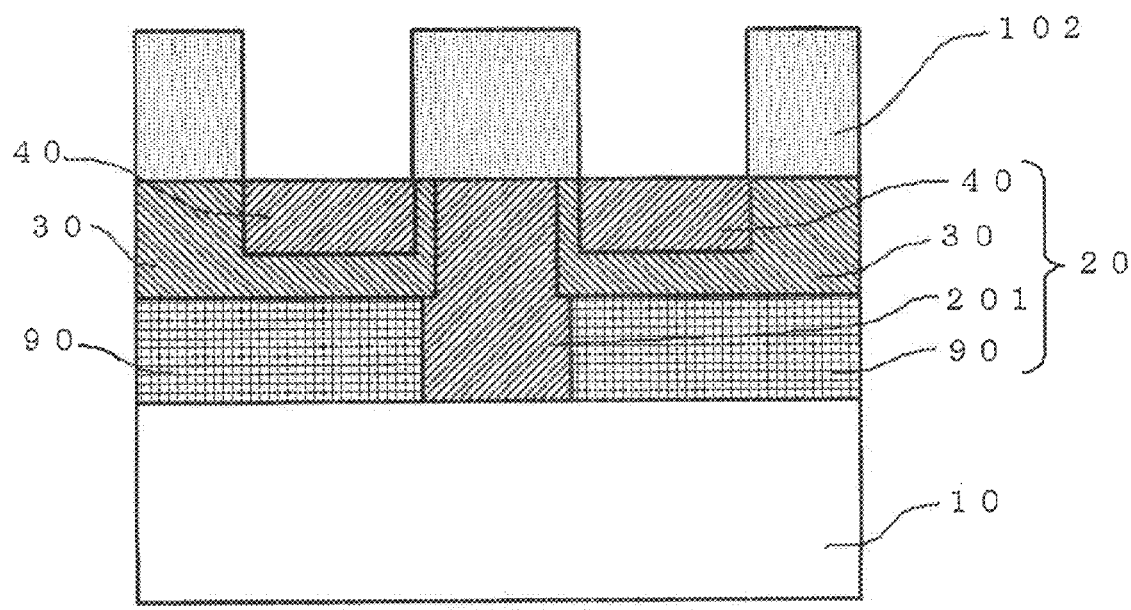
FIG. 7 is a cross-sectional schematic view showing the method for manufacturing the silicon carbide semiconductor device of the first embodiment of the present invention.
Figure 8:
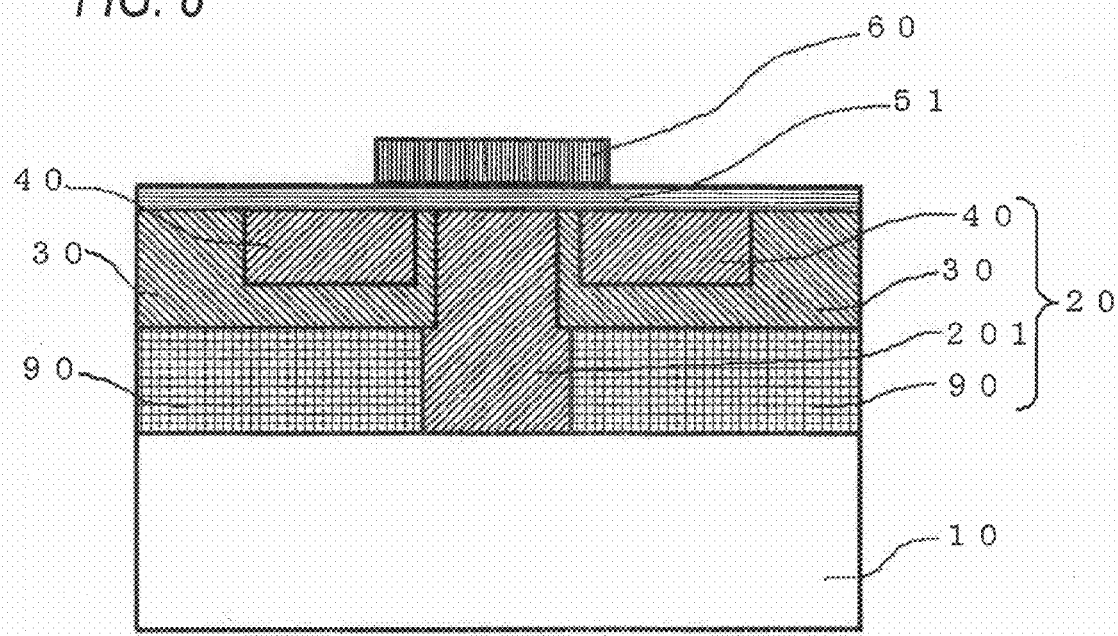
FIG. 8 is a cross-sectional schematic view showing the method for manufacturing the silicon carbide semiconductor device of the first embodiment of the present invention.
Figure 9:
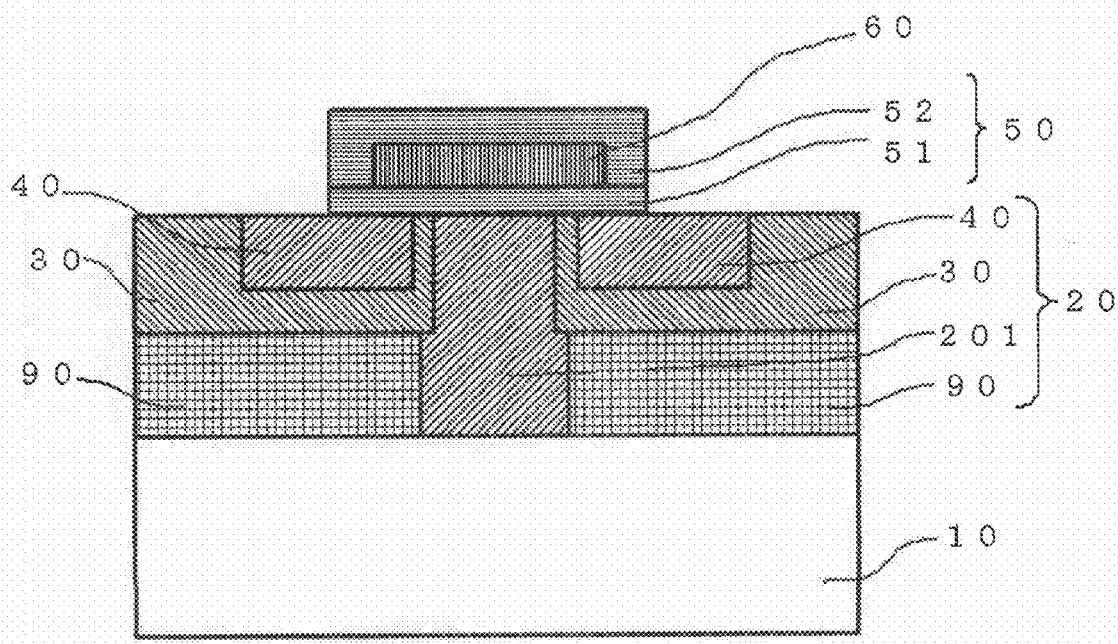
FIG. 9 is a cross-sectional schematic view showing the method for manufacturing the silicon carbide semiconductor device of the first embodiment of the present invention.
Figure 10:
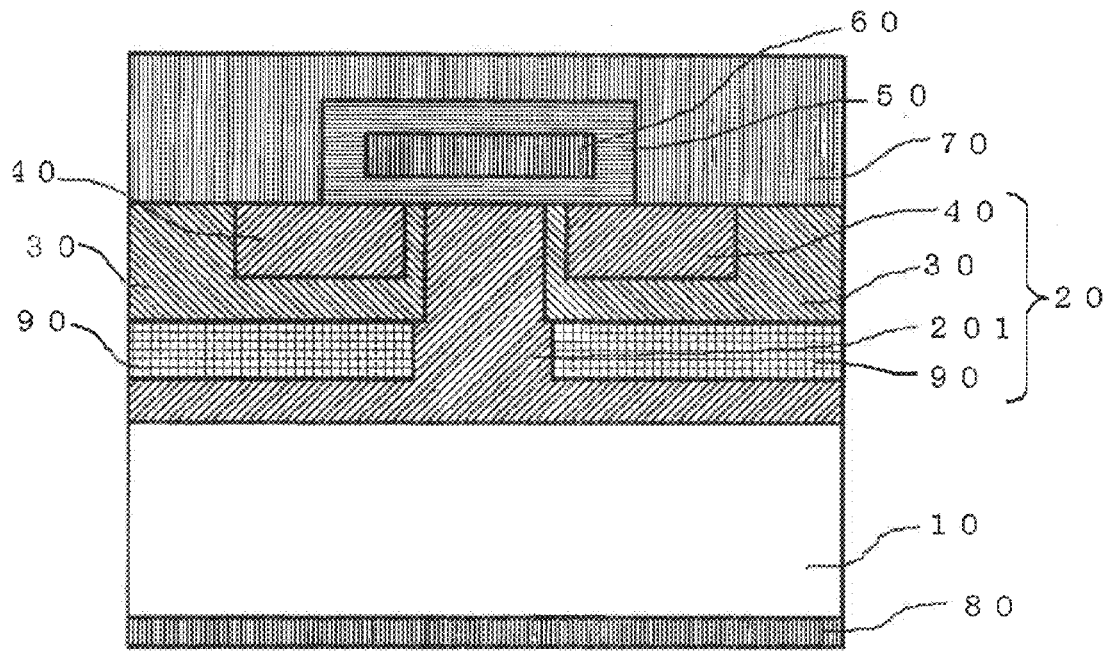
FIG. 10 is a cross-sectional schematic view showing the method for manufacturing the silicon carbide semiconductor device of the first embodiment of the present invention.
Figure 11:
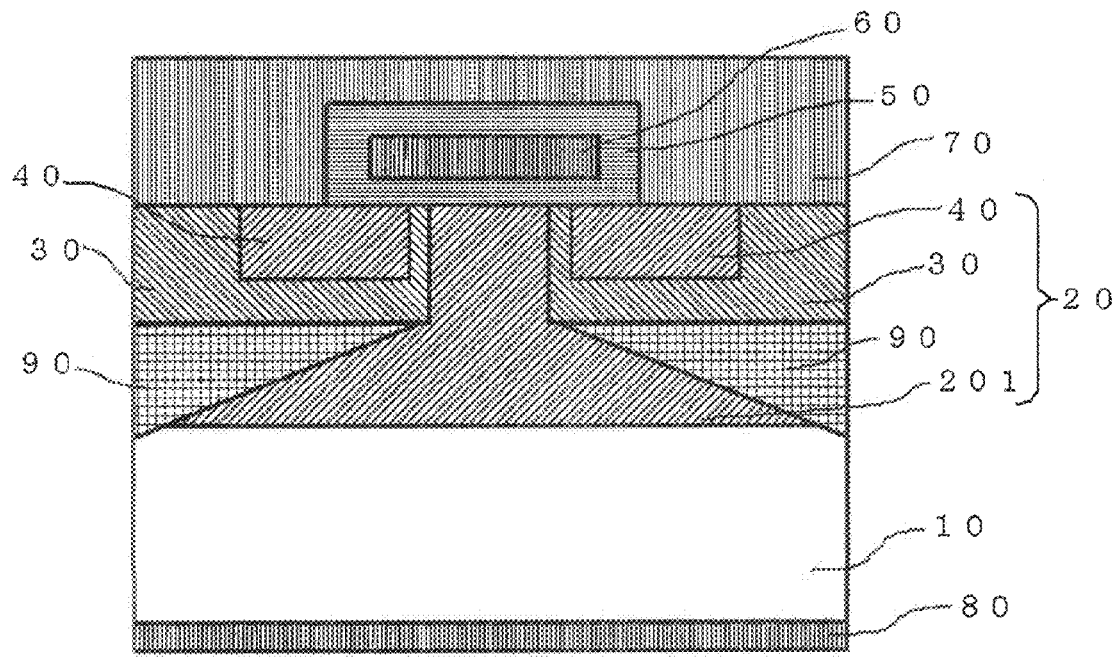
FIG. 11 is a cross-sectional schematic view showing the silicon carbide semiconductor device of a second embodiment of the present invention.
Figure 12:
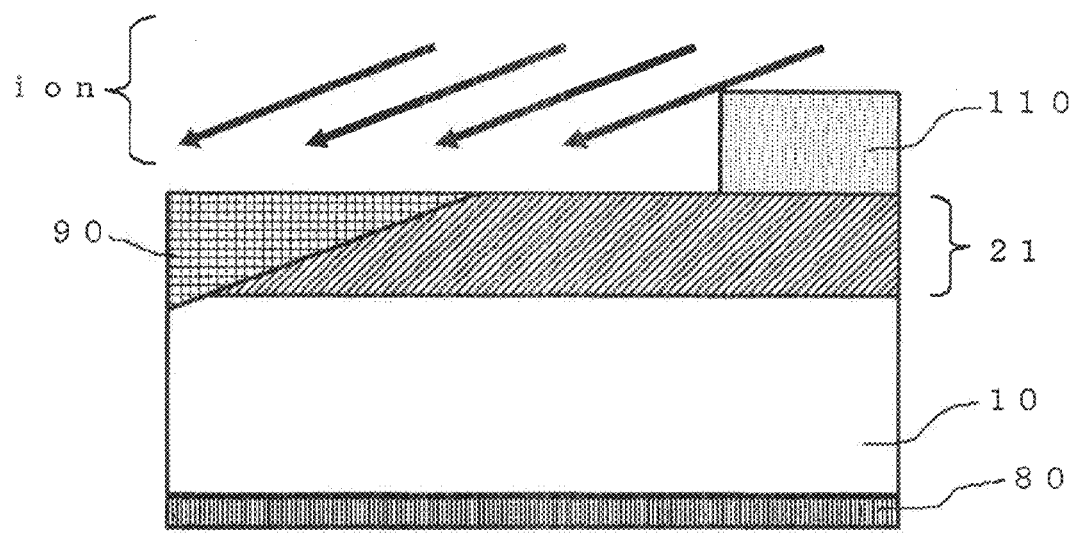
FIG. 12 is a cross-sectional schematic view showing a method for manufacturing the silicon carbide semiconductor device of the second embodiment of the present invention.
Figure 13:
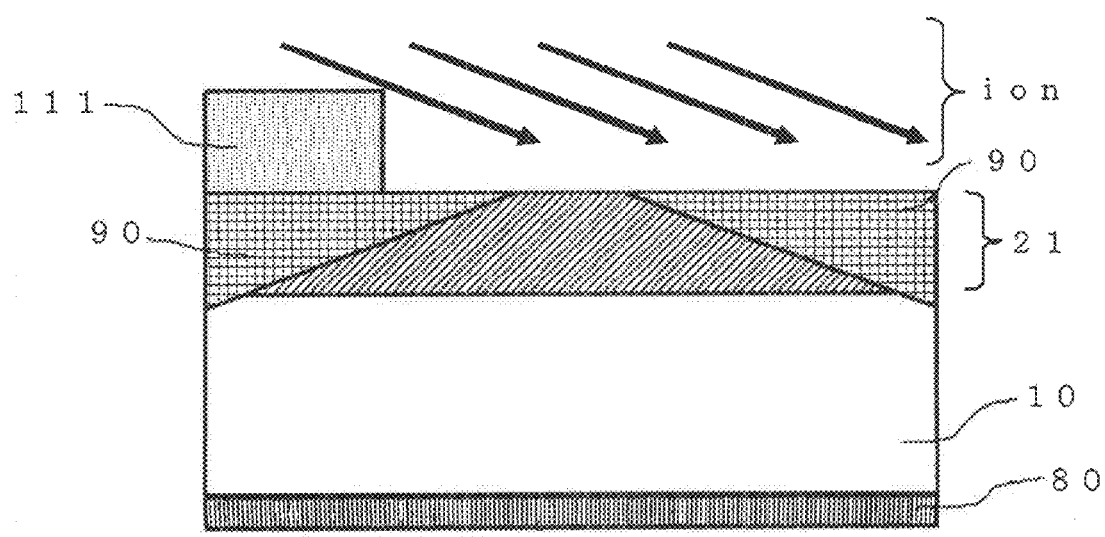
FIG. 13 is a cross-sectional schematic view showing the method for manufacturing the silicon carbide semiconductor device of the second embodiment of the present invention.
Figure 14:
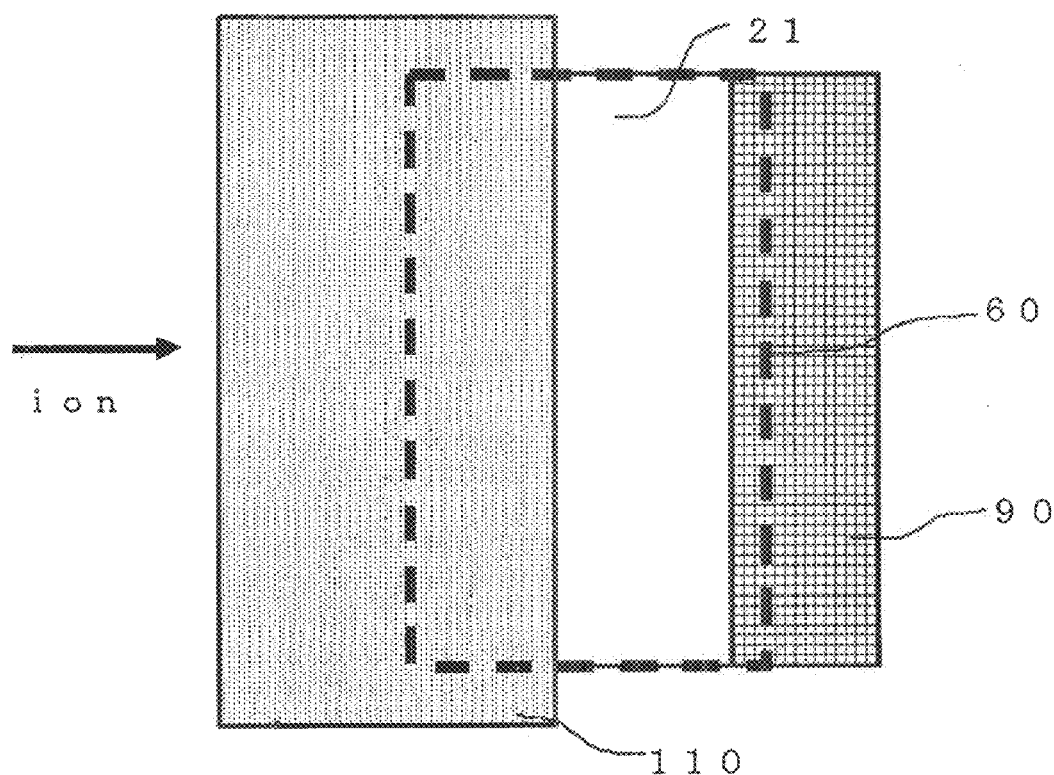
FIG. 14 is a cross-sectional schematic view showing the method for manufacturing the silicon carbide semiconductor device of the second embodiment of the present invention.
Figure 15:
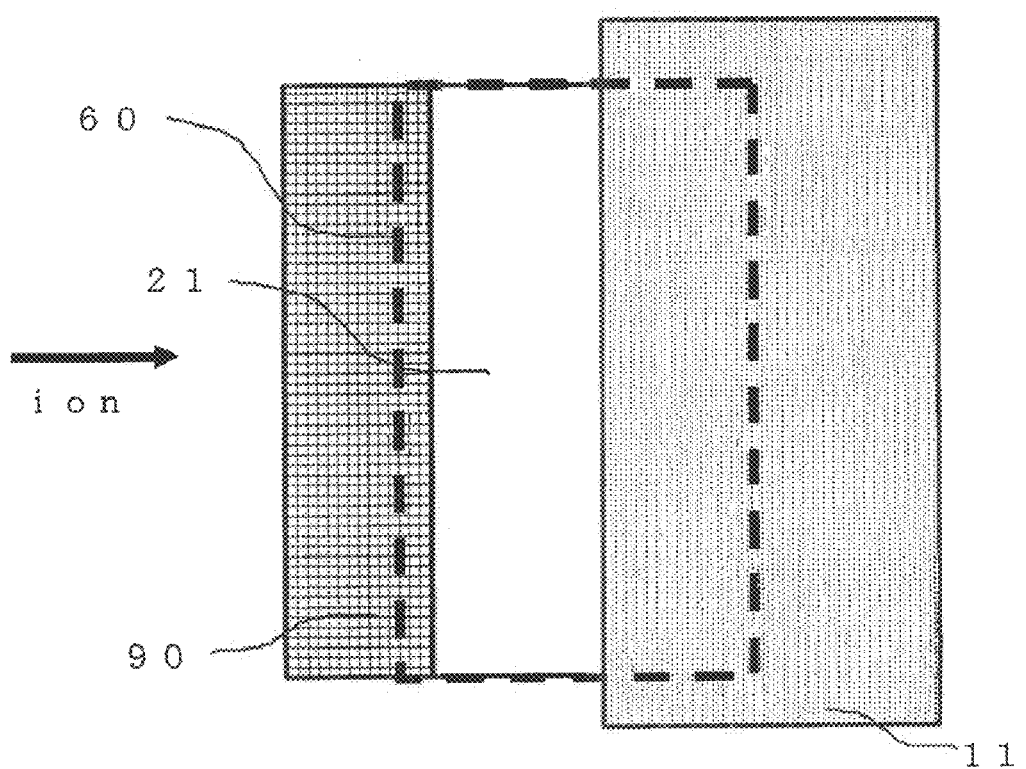
FIG. 15 is a cross-sectional schematic view showing the method for manufacturing the silicon carbide semiconductor device of the second embodiment of the present invention.
Figure 16:
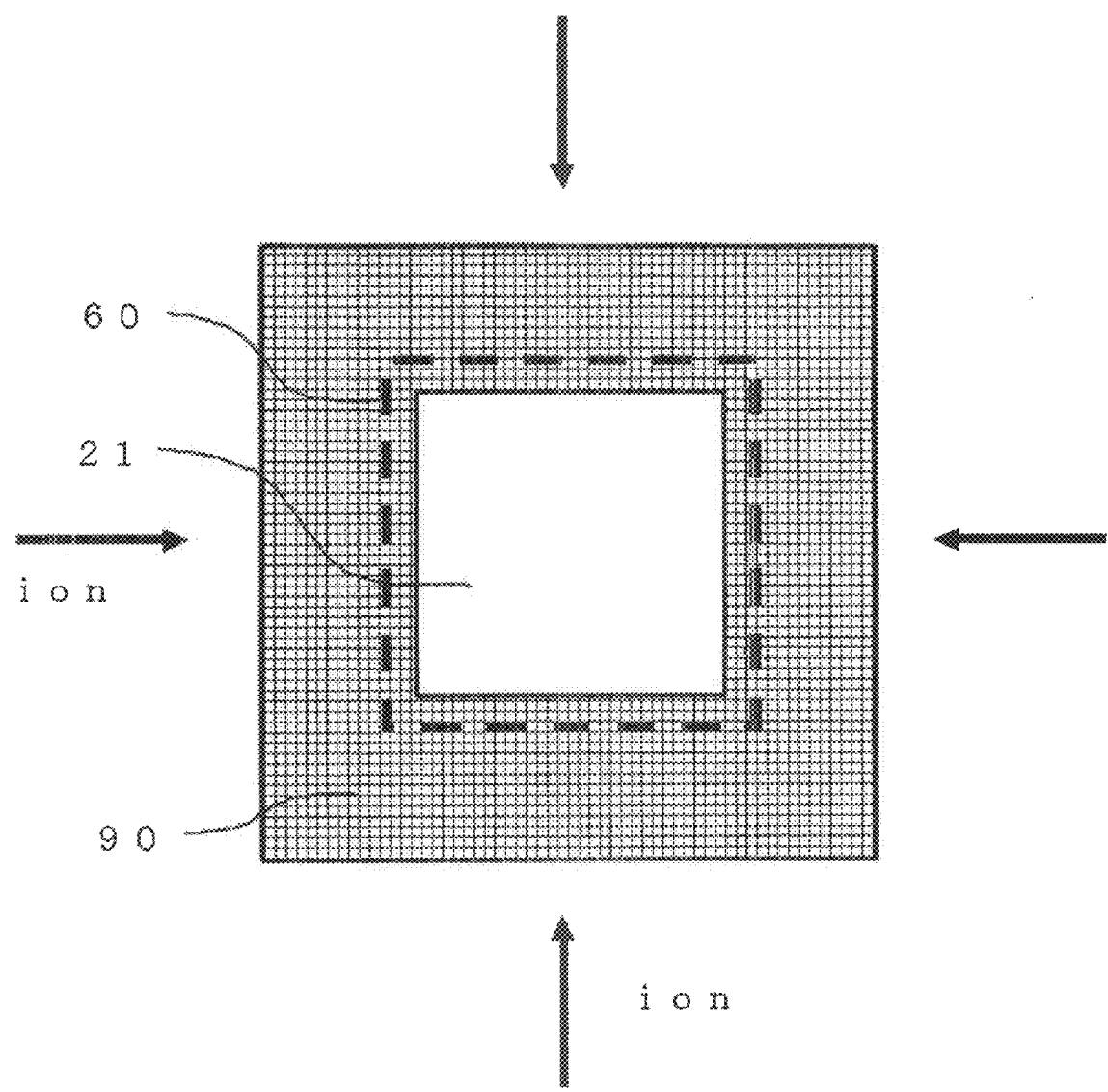
FIG. 16 is a plan schematic view showing the method for manufacturing the silicon carbide semiconductor device of the second embodiment of the present invention when viewed from above.
Figure 17:
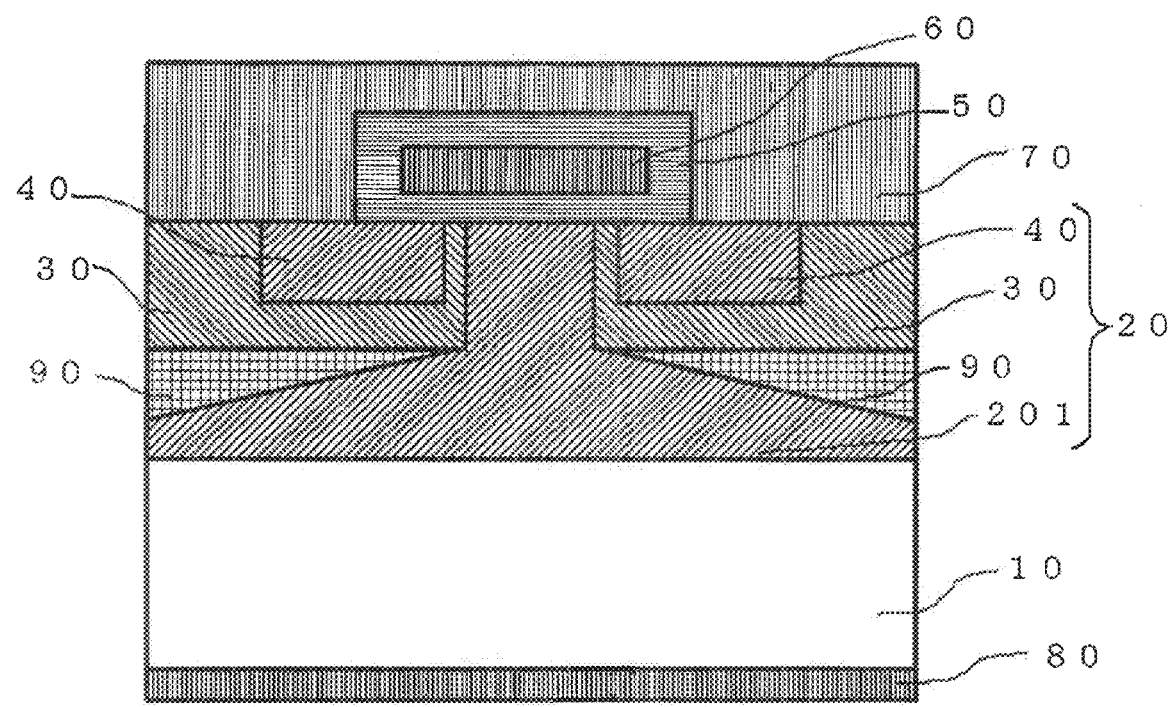
FIG. 17 is a cross-sectional schematic view showing the silicon carbide semiconductor device of the second embodiment of the present invention.

10 SILICON CARBIDE SUBSTRATE, 20 SILICON CARBIDE DRIFT LAYER, 30 BASE REGION, 40 SOURCE REGION, 50 INSULATING FILM, 60 GATE ELECTRODE, 70 SOURCE ELECTRODE, 80 DRAIN ELECTRODE, 100 TO 111 IMPLANT MASK

The invention claimed is:

1. A silicon carbide semiconductor device comprising:
a silicon carbide substrate of a first conductivity type;
a silicon carbide drift layer of the first conductivity type provided on a principal surface of the silicon carbide substrate;
a pair of base regions provided in a surface layer portion of the silicon carbide drift layer while separated from each other and that exhibit a second conductivity type;
a pair of source regions provided in interiors of surface layer portions of the pair of base regions and that exhibit a first conductivity type;
a pair of silicon carbide semi-insulating regions provided between the silicon carbide substrate and the pair of base regions;

a gate electrode provided on a surface of the silicon carbide drift layer through a gate insulating film;
a source electrode adjoining the source regions and the base regions; and
a drain electrode provided on a surface of the silicon carbide substrate opposite to the principal surface thereof,
wherein spacing between the pair of silicon carbide semi-insulating regions at lower ends thereof is larger than spacing between the pair of silicon carbide semi-insulating regions at upper ends thereof.

2. A silicon carbide semiconductor device comprising:
a silicon carbide substrate of a first conductivity type;
a silicon carbide drift layer of the first conductivity type provided on a principal surface of the silicon carbide substrate;
a pair of base regions provided in a surface layer portion of the silicon carbide drift layer while separated from each other and that exhibit a second conductivity type;
a pair of source regions provided in interiors of surface layer portions of the pair of base regions and that exhibit a first conductivity type;
a pair of silicon carbide semi-insulating regions provided between the silicon carbide substrate and the pair of base regions;
a gate electrode provided on a surface of the silicon carbide drift layer through a gate insulating film;
a source electrode adjoining the source regions and the base regions; and
a drain electrode provided on a surface of the silicon carbide substrate opposite to the principal surface thereof,
wherein spacing between the pair of silicon carbide semi-insulating regions at upper ends thereof is larger than spacing between the pair of base regions and smaller than spacing between the pair of source regions.

3. The silicon carbide semiconductor device according to claim 1, wherein spacing between the pair of silicon carbide semi-insulating regions at upper ends thereof is larger than spacing between the pair of base regions and smaller than spacing between the pair of source regions.

4. A method for manufacturing a silicon carbide semiconductor device, the method comprising:
forming a first silicon carbide drift layer of a first conductivity type on a silicon carbide substrate;
implanting impurity ions to exhibit a semi-insulating characteristic, into portions of a surface layer of the first silicon carbide drift layer with a predetermined space therebetween;
forming a second silicon carbide drift layer, on the portions of the first silicon carbide drift layer which the impurity ions to exhibit the semi-insulating characteristic are implanted to and on portions of the first silicon carbide drift layer which the impurity ions to exhibit the semi-insulating characteristic are not implanted to, through epitaxial growth;
implanting impurity ions of a second conductivity type into a portion of a surface layer of the second silicon carbide drift layer; and
implanting impurity ions of a first conductivity type into a portion of the surface layer of the second silicon carbide drift layer.

5. The method for manufacturing a silicon carbide semiconductor device according to claim 4, wherein in the implanting of the impurity ions to exhibit a semi-insulating characteristic, the impurity ions are implanted in an inclined direction with respect to a surface of the silicon carbide substrate.

* * * * *